US007259502B2

(12) United States Patent
Kami et al.

(10) Patent No.: US 7,259,502 B2
(45) Date of Patent: Aug. 21, 2007

(54) INSERT TERMINAL-CONTAINING CASE, PIEZOELECTRIC ELECTROACOUSTIC TRANSDUCER USING THE SAME, AND PROCESS FOR PRODUCING INSERT TERMINAL-CONTAINING CASE

(75) Inventors: Keiichi Kami, Toyama (JP); Mitsunori Ishimasa, Toyama (JP); Tetsuo Takeshima, Yasu (JP); Manabu Sumita, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 10/564,219

(22) PCT Filed: Jul. 15, 2004

(86) PCT No.: PCT/JP2004/010097

§ 371 (c)(1), (2), (4) Date: Jan. 11, 2006

(87) PCT Pub. No.: WO2005/015951

PCT Pub. Date: Feb. 17, 2005

(65) Prior Publication Data

US 2006/0193107 A1 Aug. 31, 2006

(30) Foreign Application Priority Data

Aug. 6, 2003 (JP) ............................. 2003-287286
May 18, 2004 (JP) ............................. 2004-147404

(51) Int. Cl.
*H04R 17/00* (2006.01)
*H01L 41/053* (2006.01)
*H01L 41/047* (2006.01)

(52) U.S. Cl. ...................... 310/353; 310/324; 310/344; 310/348

(58) Field of Classification Search ................ 310/324, 310/344, 348, 353; 381/190
See application file for complete search history.

(56) References Cited

U.S. PATENT DOCUMENTS 3,340,410 A * 9/1967 Sanford ...................... 310/353

(Continued)

FOREIGN PATENT DOCUMENTS

| | | | |
|---|---|---|---|
| JP | 02-216896 | | 8/1990 |
| JP | 04-272671 | * | 9/1992 |
| JP | 2001-095094 | | 4/2001 |
| JP | 2002-238094 | | 8/2002 |
| JP | 2003-058166 | | 2/2003 |
| JP | 2004-015768 | | 1/2004 |

OTHER PUBLICATIONS

International Search Report for PCT Application No. PCT/JP2004/010097, mailed Feb. 27, 2005.

*Primary Examiner*—Thomas M. Dougherty
(74) *Attorney, Agent, or Firm*—Keating & Bennett, LLP

(57) ABSTRACT

An insert terminal containing case includes a bottom wall, four side walls, and an opening at the upper portion, wherein a terminal made of a metal plate is vertically fixed to at least one of the four side walls by insert molding. A groove is vertically arranged at the outer side surface of the side wall fixing the terminal, the groove extending downward, the outer side surface of the terminal is partially exposed at the groove, and the inner side surface opposite the outer side surface of the terminal exposed at the groove is partially exposed at the inner side surface of the side wall. Therefore, when the terminal is provided in the case by insert molding, molding can be performed only using upper and lower dies. Furthermore, the terminal can be reliably exposed at the inner surface of the side wall. The insert terminal containing case has the minimum difference between the opening dimension of the case and the dimension of a piezoelectric diaphragm and is molded without using a sliding die.

5 Claims, 8 Drawing Sheets

U.S. PATENT DOCUMENTS

| | | | | |
|---|---|---|---|---|
| 4,859,898 | A * | 8/1989 | Aubry et al. | 310/353 |
| 6,894,423 | B2 * | 5/2005 | Takeshima et al. | 310/324 |
| 6,969,942 | B2 * | 11/2005 | Takeshima et al. | 310/324 |
| 7,141,919 | B1 * | 11/2006 | Hamada et al. | 310/348 |
| 2001/0009343 | A1 * | 7/2001 | Sawai et al. | 310/320 |
| 2003/0107300 | A1 * | 6/2003 | Nakamura et al. | 310/324 |
| 2004/0085001 | A1 * | 5/2004 | Takeshima | 310/331 |
| 2004/0124748 | A1 * | 7/2004 | Takeshima et al. | 310/331 |
| 2004/0205949 | A1 * | 10/2004 | Takeshima et al. | 29/25.35 |
| 2004/0251790 | A1 * | 12/2004 | Masuko et al. | 310/348 |

* cited by examiner

INSERT MOLDING

DETACHMENT OF SLIDING DIE

DETACHMENT OF UPPER AND LOWER DIES

INSERT TERMINAL-CONTAINING CASE, PIEZOELECTRIC ELECTROACOUSTIC TRANSDUCER USING THE SAME, AND PROCESS FOR PRODUCING INSERT TERMINAL-CONTAINING CASE

BACKGROUND OF THE INVENTION

1. Field of the Invention

The present invention relates to an insert terminal containing case and a piezoelectric electroacoustic transducer including the case.

2. Description of the Related Art

Piezoelectric electroacoustic transducers, such as a piezoelectric sounder and a piezoelectric receiver that produce alarm sounds and operation sounds, have been widely used in electronic devices, household electric appliances, mobile phones, or the like. An exemplary piezoelectric electroacoustic transducer includes a piezoelectric diaphragm placed in an insert terminal containing case and bonded with the insert terminal containing case without an air leakage, and a cover having a sound-emitting hole, the cover being bonded to an opening at the upper portion of the case. One example of this piezoelectric diaphragm is a unimorph piezoelectric diaphragm in which a piezoelectric component made of a piezoceramic is bonded to a surface of a metal plate. Another example of this piezoelectric diaphragm is a bimorph piezoelectric diaphragm including a laminated piezoceramic.

FIG. 15 shows an example of a piezoelectric electroacoustic transducer described in Japanese Unexamined Patent Application Publication No. 2003-58166. The transducer includes a case 40, a piezoelectric diaphragm 42 contained in the case 40, and terminals 43 provided on the case 40 by insert molding. A supporting portion 45 is provided at the inner periphery of the case 40. The piezoelectric diaphragm 42 is supported by the supporting portion 45. An elastic insulator 48 covers edges of the piezoelectric diaphragm 42. A conductive adhesive 46 is applied on the insulator 48 to electrically connect the piezoelectric diaphragm 42 with the terminal 43. After application of the conductive adhesive 46, the periphery of the piezoelectric diaphragm 42 is fixed to the case 40 with an elastic adhesive such as silicone rubber (not shown), and a cover (not shown) is bonded to the opening at the upper portion of the case 40.

To ensure electrical continuity to the conductive adhesive 46, the terminal 43 needs to be exposed at the inside of the case 40 by a predetermined length. However, when the terminal 43 is exposed in the horizontal direction as shown in FIG. 15, the dimension S of the piezoelectric diaphragm 42 must be reduced by the exposed length of the terminal 43 compared with the opening dimension L. In recent years, trends towards miniaturization of electronic devices have also required miniaturization of piezoelectric electroacoustic transducers. Miniaturization of the case 40 means a reduction in the dimension S of the piezoelectric diaphragm 42. The reduction in the dimension S of the piezoelectric diaphragm 42 increases its resonance frequency, which causes a reduction in sound pressure, and is thus undesirable. Therefore, to reduce the resonance frequency and increase the sound pressure, it is important to achieve the minimum difference between the opening dimension L of the case 40 and the dimension S of the piezoelectric diaphragm 42.

SUMMARY OF THE INVENTION

In order to overcome the problems described above, preferred embodiments of the present invention provide an insert terminal containing case capable of achieving the minimum difference between the opening dimension of the case and the dimension of the piezoelectric diaphragm, and a piezoelectric electroacoustic transducer including such a unique case. Another preferred embodiment of the present invention provides a process for producing an insert terminal containing case, the process being capable of molding the case without using a complicated die, such as a sliding die, and preventing the deformation of a terminal due to a pressure exerted during molding.

One preferred embodiment provides an insert terminal containing case including a bottom wall, four side walls, and an opening at the upper portion, wherein a terminal made of a metal plate is vertically fixed to at least one side wall among the walls by insert molding, a groove is vertically arranged at the outer side surface of the side wall fixing the terminal, the groove extending downward, the outer side surface of the terminal is partially exposed at the groove, and the inner side surface opposite to the outer side surface of the terminal is partially exposed at the inner side surface of the side wall.

In the present preferred embodiment, the terminal made of the metal plate is vertically fixed at the side wall of the case by insert molding, and the inner side surface of the terminal is exposed at the inner side surface of the side wall. Thus, when a piezoelectric diaphragm is provided in the case, it is possible to bring the side wall of the case close to the periphery of the piezoelectric diaphragm, thereby reducing the dimensional difference between the case and the piezoelectric diaphragm. As a result, it is possible to lower the resonance frequency of the piezoelectric diaphragm and increase the sound pressure.

When the terminal is provided at the side wall of the case by insert molding, it is necessary to prevent the deformation of the terminal due to pressure exerted during molding. Accordingly, both inner and outer side surfaces of the terminal are held by a projection provided at a lower die and a portion of an upper die, thus preventing the deformation of the terminal due to a pressure exert during molding and surely exposing the terminal at the inner side surface of the side wall. In such a case, the terminal can be provided by insert molding using only the upper and lower dies without using a complicated die, such as a sliding die. Thus, the die has a simple structure, the molding time can be reduced, and many insert terminal containing cases are easily produced at the same time.

The groove corresponding to the projection of the lower die is provided at the outer side surface of the side wall of the case. The groove may be provided not at the outer side surface of the side wall of the case, but at the inner side surface. In this case, since the groove extends upward along the inner side surface of the side wall, the thickness at the upper end of the side wall having the groove of the case is preferably substantially identical to that of the terminal. A thin metal plate having a thickness of, for example, about 0.1 mm is preferably used as the terminal. However, if the thickness of the resin case is about 0.1 mm, mechanical strength is insufficient. In addition, a bonding area required for bonding a cover or the like cannot be ensured.

In contrast, providing the groove extending downward at the outer side surface of the side wall can ensure a predetermined thickness at the upper end of the side wall, thus resolving the above described problems.

Furthermore, a cutout for exposing the outer side surface of the terminal may be provided in the vicinity of the bottom of the outer side surface of the side wall, the area of the terminal exposed at the cutout being greater than that of the terminal exposed at the groove, wherein the lower end of the groove may be extended to the cutout.

In a case for a surface mount electronic device, the terminal is preferably exposed at the outer side surface of the side wall of the case in a predetermined range because a solder fillet is provided for mounting a circuit substrate or the like. On the other hand, the groove is provided inevitably to hold the outer side surface of the terminal during insert molding and preferably has the shortest possible length. When the cutout for exposing the terminal at the outer side surface of the side wall of the case is provided, the lower end of the groove is extended to the cutout. As a result, it is possible to shorten the length of the groove and to minimize a reduction in the strength of the case.

Furthermore, the upper end of the groove is preferably terminated at a position lower than the position of the upper end of the terminal. The upper end of the groove may be disposed at a position equal to or higher than that of the upper end of the terminal. In this case, since the front and back surfaces of the upper end of the terminal are exposed at the inner and outer surfaces of the side wall, a degree of strength for holding the upper end of the terminal is insufficient. As a result, the terminal is easily deformed inward or outward. In contrast, disposing the upper end of the groove at a position lower than that of the upper end of the terminal permits the outer side surface of the upper end of the terminal to be held by the resin portion of the case, thus preventing the inward or outward deformation of the terminal.

Furthermore, the insert terminal containing case according to the present preferred embodiment of the invention is preferably applied to a piezoelectric electroacoustic transducer.

For the piezoelectric electroacoustic transducer, the dimension of the piezoelectric diaphragm is preferably brought close to the opening dimension of the case from the standpoint of lowering the resonance frequency of the piezoelectric diaphragm and increasing the sound pressure. In the case according to the present preferred embodiment of the invention, the terminal is exposed at the inner surface of the side wall in the longitudinal direction which is substantially perpendicular to the piezoelectric diaphragm. Therefore, it is possible to reduce the gap between the piezoelectric diaphragm and the side wall of the case and to lower the frequency and to strengthen the sound pressure of the piezoelectric diaphragm.

Furthermore, a process for producing an insert terminal containing case is preferably used, the process including the steps of preparing an upper die having a projection for forming the inner surface of a case and a lower die having a depression for forming the external surface of the case, disposing the base plate portion of an L-shaped terminal on the bottom surface of the depression of the lower die, the terminal being made of a metal plate, and then clamping the upper and lower dies such that the connecting portion of the terminal is held between the outer side surface of the projection of the upper die and the inner side surface of the depression of the lower die, injecting a resin into a cavity provided between the projection of the upper die and the depression of the lower die, and then curing the resin, and separating the upper and lower dies after curing the resin to take the case out.

By using the above described upper and lower dies, it is possible to produce the insert terminal containing case including the terminal being exposed at the inner surface of the side wall and to prevent the deformation of the connecting portion of the terminal due to a pressure exerted during molding without using a sliding die.

Furthermore, a protruding portion is provided on the inner side surface of the depression of the lower die, the upper end of the protruding portion being disposed at a position lower than the position of the upper end of the connecting portion of the terminal, and the lower end of the protruding portion extending to the bottom surface of the depression. When the connecting portion of the terminal is held between the inner side surface of the protruding portion and the outer side surface of the projection of the upper die, a resin portion covering the upper end of the connecting portion of the terminal can be provided at the upper end of the side wall of the case. Thereby, the upper end of the connecting portion of the terminal is protected with the resin portion, thus preventing a bend in the terminal.

Furthermore, arm portions are provided on the connecting portion of the terminal, each arm portion extending from each side of the connecting portion of the terminal, and in the clamping step, both front and back surfaces of the arm portions are held between the outer side surface of the projection of the upper die and the inner side surface of the depression of the lower die. Therefore, the terminal can be exposed only in the vicinity of the corner of the inner surface of the case.

In the present preferred embodiment, the terminal is longitudinally fixed at the side wall of the case by insert molding and the inner side surface of the terminal is exposed at the inner side surface of the side wall. Therefore, when the piezoelectric diaphragm is provided in the case, it is possible to bring the side wall of the case close to the periphery of the piezoelectric diaphragm and to reduce the dimensional difference between the case and the piezoelectric diaphragm. As a result, it is possible to lower the resonance frequency of the piezoelectric diaphragm and to strengthen the sound pressure.

Furthermore, the groove extending vertically downward is provided at the outer side surface of the side wall having the terminal of the case, the outer side surface of the terminal is partially exposed at the groove, and the inner side surface opposite the outer side surface of the terminal exposed at the groove is partially exposed at the inner side surface of the side wall. Therefore, when the terminal is provided by insert molding, it is possible to hold both inner and outer side surfaces of the terminal by the upper and lower dies, to prevent the deformation of the terminal due to a pressure exerted during molding, and to surely expose the terminal at the inner side surface of the side wall.

Furthermore, in the present preferred embodiment, a resin is injected while the connecting portion of the terminal is held between the outer side surface of the projection of the upper die and the inner side surface of the depression of the lower die. Therefore, it is possible to provide the terminal by insert molding using only the upper and lower dies without using a sliding die. Thus, the die has a simple structure, thereby resulting in low cost and reducing the molding time. Furthermore, many insert terminal containing cases are easily produced at the same time.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to non-limiting examples below.

EXAMPLE 1

FIGS. 1 to 4 each show an example of a piezoelectric electroacoustic transducer, such as a piezoelectric sounder, including a case according to the present preferred embodiment. This piezoelectric sounder includes a piezoelectric diaphragm 1, a case 20, and a cover 30. The case 20 and the cover 30 define a cabinet.

Figure 1:
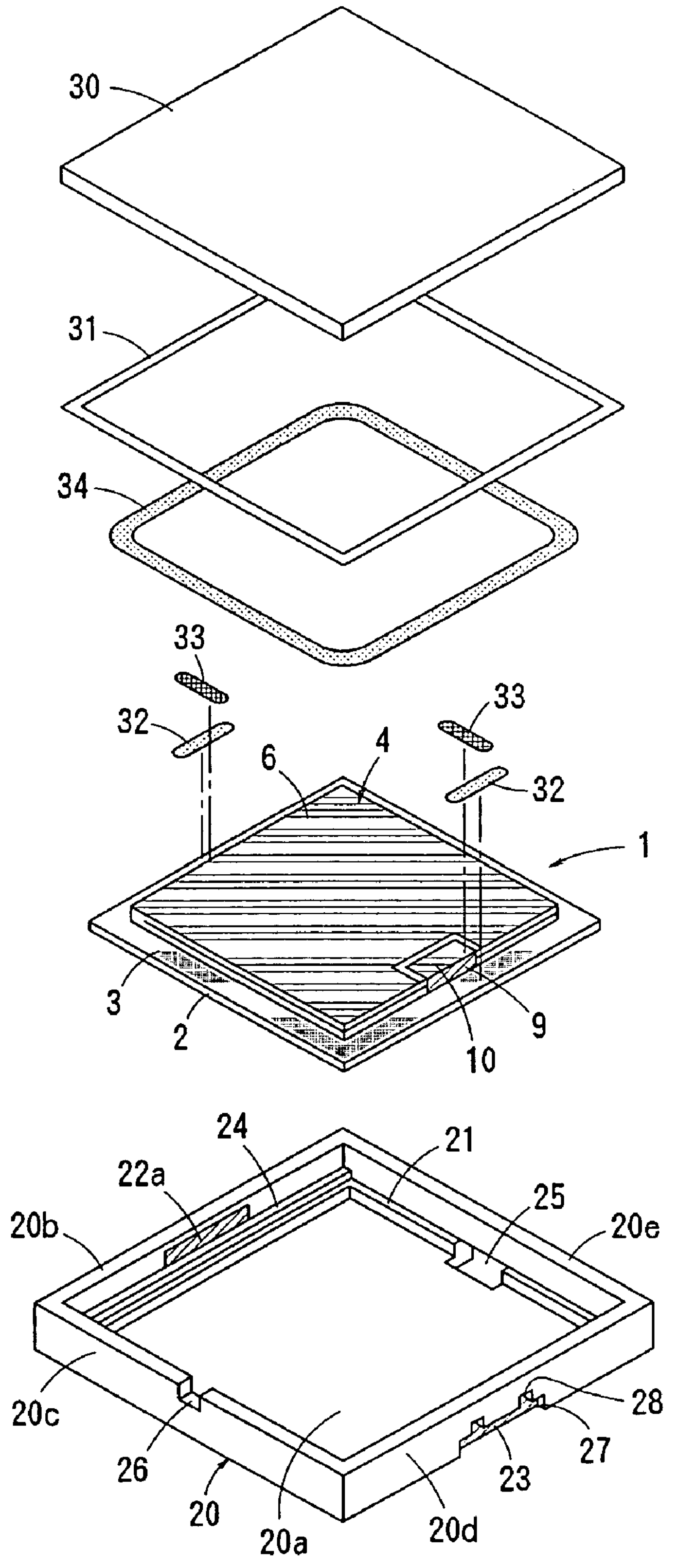
FIG. 1 is an exploded perspective view of an example of a piezoelectric electroacoustic transducer using a case according to a preferred embodiment of the present invention.
Figure 2:
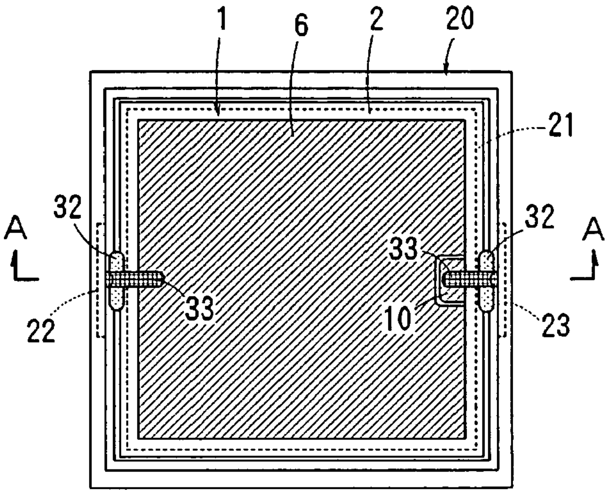
FIG. 2 is a plan view of the piezoelectric electroacoustic transducer without the cover and the adhesive.
Figure 3:
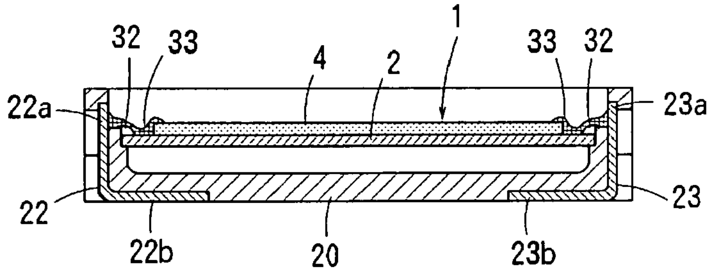
FIG. 3 is a cross-sectional view taken along line A-A in FIG. 2.
Figure 4:
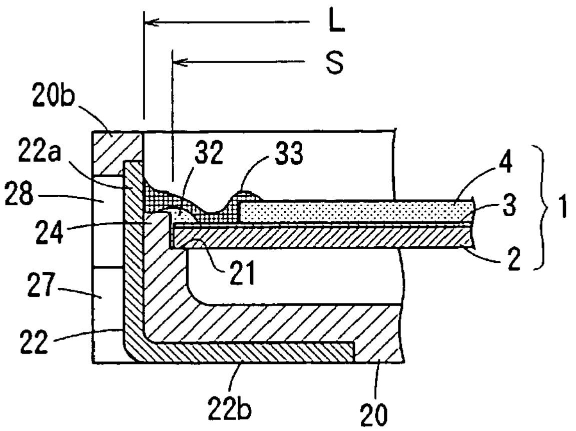
FIG. 4 is a fragmentary enlarged view of FIG. 3.
Figure 5:
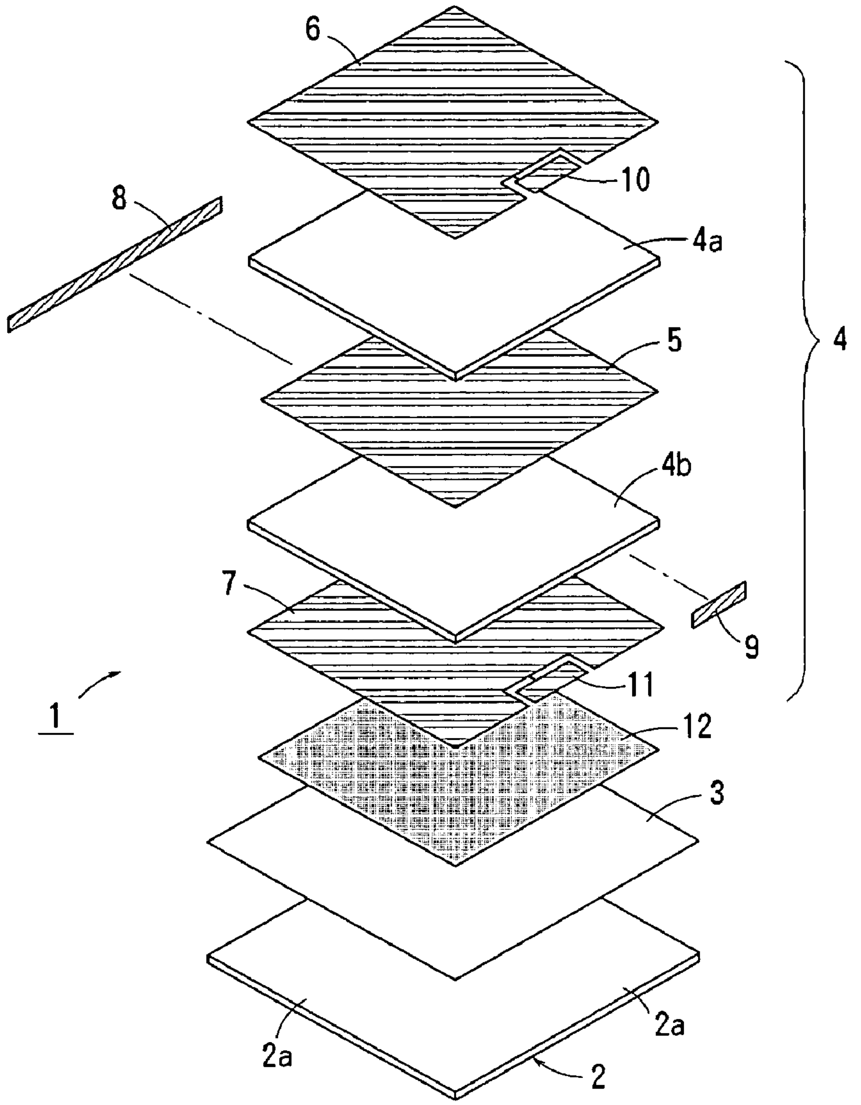
FIG. 5 is an exploded perspective view of a piezoelectric diaphragm.
Figure 6:
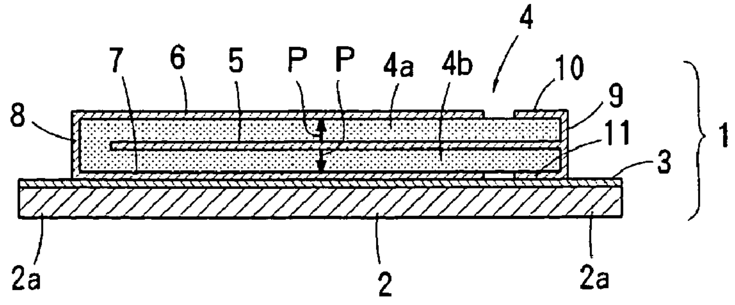
FIG. 6 is a cross-sectional view of the piezoelectric diaphragm.

As shown in FIGS. 5 and 6, the piezoelectric diaphragm 1 in this Example includes a substantially square metal plate 2, an insulating layer 3 on the entire surface of the metal plate 2, and a substantially square piezoelectric component 4 that is smaller than the metal plate 2. The piezoelectric component 4 is bonded on the insulating layer 3. The metal plate 2 is preferably made of a material having spring resilience, for example, phosphor bronze, 42Ni, or the like. The insulating layer 3 may be a resin coating made of, for example, a polyimide or an epoxy. Alternatively, the insulating layer 3 may be an oxide film prepared by performing an oxidizing treatment.

The piezoelectric component 4 is formed by laminating two green sheets to be piezoceramic layers 4*a* and 4*b* with an internal electrode 5 therebetween and then co-firing the resulting laminate. External electrodes 6 and 7 are provided on substantially the entire front and back surfaces of the piezoelectric component, respectively. As represented by arrows P in FIG. 6, the piezoceramic layers 4*a* and 4*b* are oppositely polarized in the thickness direction. One side of the internal electrode 5 is exposed at an end of the piezoelectric component 4, but the opposite side is terminated at a specified distance away from an end of the piezoelectric component 4. The external electrodes 6 and 7 on the front and back surfaces of the piezoelectric component 4 are connected to each other via one end electrode 8. The internal electrode 5 is connected to interconnecting electrodes 10 and 11 on the front and back surfaces, respectively, via the other end electrode 9. Each of the interconnecting electrodes 10 and 11 is a small electrode provided at the middle of a side of the piezoelectric component 4 along the side and is electrically separated from the external electrodes 6 and 7 at the front and back surfaces. The end electrode 8 has a length corresponding to the length of a side of the piezoelectric component 4. The other end electrode 9 has a length corresponding to the length of the interconnecting electrodes 10 and 11. In this preferred embodiment, the interconnecting electrodes 10 and 11 are provided at both front and back surfaces, respectively, so that the piezoelectric component 4 is non-directional. Thus, the interconnecting electrode 11 may be omitted. Furthermore, each of the interconnecting electrodes 10 and 11 may have a length corresponding to the length of a side of the piezoelectric component 4. The back surface of the piezoelectric component 4 is bonded on the middle of the upper surface of the insulating layer 3 with an adhesive 12 such as an epoxy adhesive (see FIG. 5). The metal plate 2 has a size that is greater than that of the piezoelectric component 4. The insulating layer 3 continuously extends to the surface of extended portions 2*a*, extending outwardly more than the piezoelectric component 4.

The case 20 is preferably made of a resin. The case 20 preferably has a substantially square box shape and includes a bottom wall 20*a* and four side walls 20*b* to 20*e*. A heat-resistant resin, such as a liquid-crystalline polymer (LCP), a syndiotactic polystyrene (SPS), or a polyphenylene sulfide (PPS) is preferably used as a material defining the case. A supporting portion 21 for supporting the diaphragm 1 on the entire perimeter thereof is provided on the inner surface of the side walls 20*b* to 20*e* of the case 20. Internal connecting portions 22*a* and 23*a* of terminals 22 and 23 are exposed at the inner side surfaces of two side walls 20*b* and 20*d* that are opposite each other, the terminals 22 and 23 being electrically connected to the front-side external electrode 6 and the interconnecting electrode 10 of the diaphragm 1, respectively. Partitioning portions 24 are provided between the supporting portion 21 and the internal connecting portions 22*a* and 23*a* of the terminals 22 and 23, the partitioning portions 24 being integral with the case 20 (see FIG. 4). The partitioning portions 24 function as spacers for preventing the metal plate 2 from being in contact with the terminals 22 and 23 when the metal plate 2 is placed on the supporting portion 21 as described below.

Figure 7:
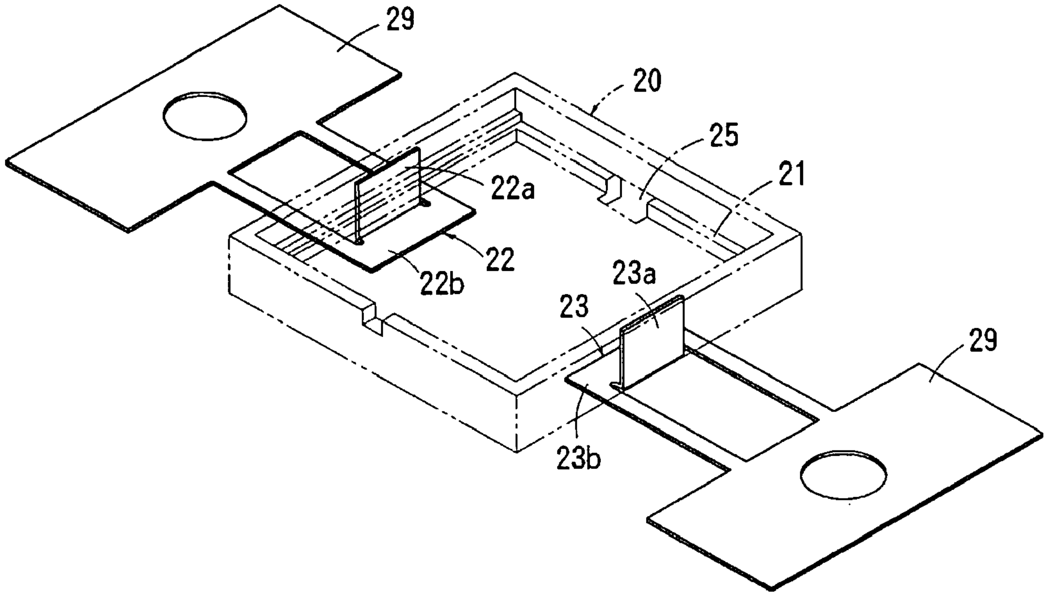
FIG. 7 shows a state of terminals and a case in insert molding.

The terminals 22 and 23 are formed in the case 20 preferably by insert molding and are each made of, for example, a metal plate, such as phosphor bronze, having a thickness of about 0.1 mm. As shown in FIG. 7, the internal connecting portions 22*a* and 23*a* of the terminals 22 and 23, integrally formed by punching a hoop material 29, are bent perpendicularly upward, and these bent portions serve as internal connecting portions connected to the diaphragm 1. In this way, by disposing the internal connecting portions 22*a* and 23*a* substantially perpendicular to the bottom surface of the case or diaphragm 1, the internal connecting portions 22*a* and 23*a* do not extend inside the case 20. Thus, it is possible to reduce the difference between the opening dimension L of the case 20 and the dimension S of the piezoelectric diaphragm 1. External connecting portions 22*b* and 23*b* of the terminals 22 and 23 extend inside along the bottom surface of the case 20.

Figure 8:
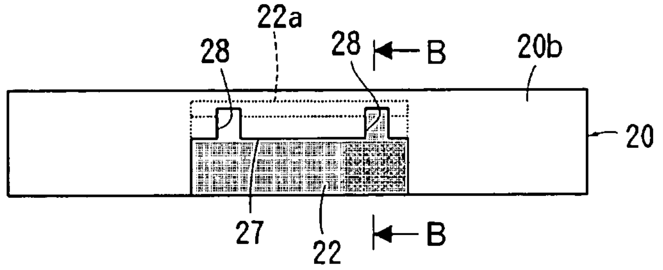
FIG. 8 is a side view of a case.
Figure 9:
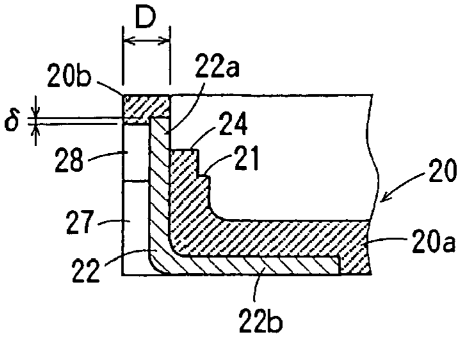
FIG. 9 is a cross-sectional view taken along line B-B in FIG. 8.

As shown in FIGS. 8 and 9, in each of the outer side surfaces of the side walls 20*b* and 20*d* including the terminals 22 and 23, a wide cutout 27 is provided near the bottom surface, and narrow grooves 28 are provided at the upper end of the cutout 27, the narrow grooves 28 extending longitudinally. The lower end of each groove 28 is extended to the cutout 27. The terminals 22 and 23 are partially exposed at the grooves 28. The inner side surfaces, specifically internal connecting portions 22*a* and 23*a*, opposite the outer side surfaces of the terminals 22 and 23 exposed at the grooves 28 are partially exposed at the inner side surface of the side walls 20*b* and 20*d*. The upper end of each groove 28 is terminated at a position lower than the position of the upper end of each of the terminals 22 and 23 by a dimension of δ. That is, the outer side surfaces of the upper ends of the terminals 22 and 23 are covered with the side walls 20*b* and 20*d*. Thus, the upper ends of the terminals 22 and 23 are held from their outer sides, thereby preventing outward and inward deformations of the terminals 22 and 23. The side walls 20*b* and 20*d* each have a thickness of D that is greater than those of the terminals 22 and 23, thereby ensuring the strength of the case 20 and an area required for bonding the cover 30 to the case 20.

A lower sound emitting hole 25 is provided at the bottom of one side wall 20*e*, in which the terminals 22 and 23 are not provided. A groove 26 for emitting sound is provided at the top of the other side wall 20*c*. The cover 30 in this example is preferably made of the same material as that of the case 20 and has a flat shape. By bonding the cover 30 onto the top of the side walls of the case 20 with an adhesive 31, the groove 26 becomes an upper sound emitting hole. The cover 30 does not necessarily have a flat shape, but may have a cap shape having a concave cross-section. The upper sound emitting hole 26 is not necessarily a groove provided at the top of the side wall of the case 20, but may be a hole provided in the cover 30.

The piezoelectric diaphragm 1 is disposed in the case 20 such that the metal plate 2 faces the bottom wall, and the periphery of the metal plate 2 is placed on the supporting portion 21. Next, an insulating material 32 is applied to the area between the periphery of the metal plate 2 and the internal connecting portions 22*a* and 23*a* of the terminals 22 and 23 in a line shape, and is then cured. Any insulating adhesive may be used as the insulating material 32, but an elastic adhesive, such as a urethane adhesive or a silicone adhesive, is preferably used. Next, the conductive adhesive 33 is applied to areas between the front-side external electrode 6 and the internal connecting portion 22*a* of the terminal 22 and between the interconnecting electrode 10 and the internal connecting portion 23*a* of the terminal 23, the conductive adhesive 33 being applied perpendicular to the insulating material 32, and is then cured. The internal connecting portions 22*a* and 23*a* of the terminals 22 and 23 are disposed perpendicularly and are exposed in large areas. Thus, areas being in electrical contact with the conductive adhesive 33 are large, and electrical contact reliability is high. The conductive adhesive 33 is preferably an elastic adhesive, such as a urethane adhesive, containing a conductive filler. The conductive adhesive 33 is applied onto the metal plate 2. Since the insulating layer 3 is provided on the metal plate 2 in advance, and the periphery of the metal plate 2 is covered with the insulating material 32, the conductive adhesive 33 is not brought into direct contact with the metal plate 2. Next, the entire perimeter of the metal plate 2 is fixed to the case 20 with an adhesive 34. Any one of known insulating adhesives may be used as the adhesive 34 but is preferably an elastic adhesive, such as a urethane adhesive or silicone adhesive. As described above, after fixing the piezoelectric diaphragm 1 to the case 20, the cover 30 is bonded to the opening at the upper portion of the case 20 with the adhesive 31. By bonding the cover 30, acoustic spaces are provided between the cover 30 and the piezoelectric diaphragm 1 and between the piezoelectric diaphragm 1 and the bottom of the case 20. Thus a surface mounting-type piezoelectric sounder is completed.

As described above, since elastic materials are used as the adhesives 32, 33, and 34 for bonding the diaphragm 1 to the case 20, the displacement of the diaphragm 1 is maximized. Thus, a large sound pressure can be obtained.

Furthermore, the electrodes of the diaphragm 1, specifically the front side external electrode 6 and the interconnecting electrode 10, are connected to the electrodes of the case 20, specifically terminals 22 and 23, with the conductive adhesive 33, thus improving electrical reliability compared with the case of an electrical contact via the metal plate 2. Moreover, the conductive adhesive 33 can be coated from above the case 20 with a coater, such as a dispenser. Therefore, automation is easily achieved, and production efficiency and quality can be improved compared with those in the case in which a lead is bonded by soldering.

When a non-DC signal, such as an alternating signal and a rectangular wave signal, having substantially the same frequency as the resonance frequency of the diaphragm 1 is applied between the terminals 22 and 23 of the case 20, the piezoelectric component 4 stretches in the plane direction, and the metal plate 2 does not stretch. Thus, a flexural deformation occurs in the piezoelectric diaphragm 1 as a whole. The periphery of the diaphragm 1 is supported by the case 20, and the gaps between the entire perimeter of the diaphragm 1 and the inner side surfaces of the side walls of the case 20 are sealed with the adhesive 34, thereby generating a predetermined acoustic wave. The acoustic wave is emitted to the exterior through the groove 26.

Since the internal connecting portions 22*a* and 23*a* of the terminals 22 and 23 are exposed at the inner side surfaces of the side walls of the case 20 and are disposed perpendicular to the bottom surface of the case or diaphragm 1, the internal connecting portions 22*a* and 23*a* do not extend inside the case 20. Therefore, the dimension S of the piezoelectric diaphragm 1 can be brought close to the opening dimension L of the case 20 at a maximum. As a result, even if the opening dimension L of the case is a constant, it is possible to enlarge the dimension S of the piezoelectric diaphragm 1, thereby lowering the resonance frequency and increasing the sound pressure.

Figure 10A:
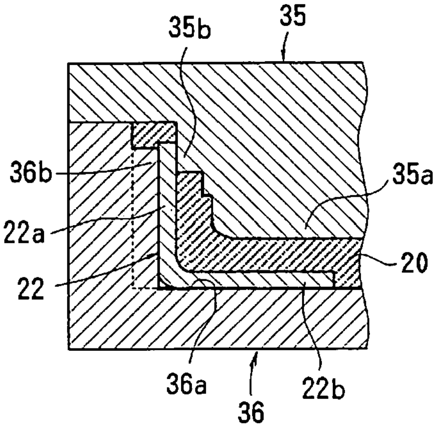
FIGS. 10A and 10B are process drawings showing a process for providing a terminal in a case according to Example 1 by insert molding.
Figure 10B:
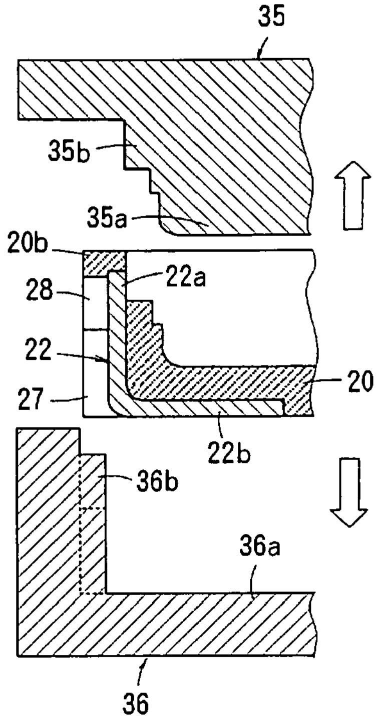

FIGS. 10A and 10B show a process of insert-molding the terminals 22 and 23 into the case 20.

FIG. 10A shows a state in which an upper die 35 and a lower die 36 are clamped, and FIG. 10B shows a state in which the upper die 35 and the lower die 36 are detached.

The upper die 35 includes a projection 35*a* for forming the inner surface of the case 20, and a portion 35*b*, which is a portion of the side surface of the projection 35*a*, protruding outward. The lower die 36 includes a depression 36*a* for forming the outer surface of the case 20, and a protruding portion 36b is provided at a portion of the side surface of the depression 36a, the protruding portion 36b protruding inward. The upper end of the protruding portion 36b is disposed at a position lower than the position of the upper end of the connecting portion 22a, described below, of the terminal 22. The lower end of the protruding portion 36b extends from the bottom surface of the depression 36a. A cavity is provided between the projection 35a and the depression 36a.

As shown in FIG. 10A, the L shaped terminal 22 is disposed between the upper and lower dies 35 and 36, and then the dies are clamped. In the clamped state, the bottom of the external connecting portion 22b of the terminal 22 is disposed on the bottom surface of the depression 36a of the lower die 36. Furthermore, both front and back surfaces of the connecting portion 22a of the terminal 22 are held by the portion 35b, which is a portion of the projection 35a of the upper die 35, and the protruding portion 36b of the lower die 36, thus preventing the deformation of the connecting portion 22a of the terminal 22 due to the injection pressure of a resin.

As shown in FIG. 10B, the upper and lower dies 35 and 36 are detached vertically. The inside space of the case 20 is formed by the projection 35a of the upper die 35. The outer surface of the case 20 is formed by the depression 36a of the lower die 36. The cutout 27 and the grooves 28 are formed by the protruding portion 36b of the lower die 36. The internal connecting portion 22a of the terminal 22 can be exposed at the inside of the side wall 20b of the case 20.

COMPARATIVE EXAMPLE

Figure 16:
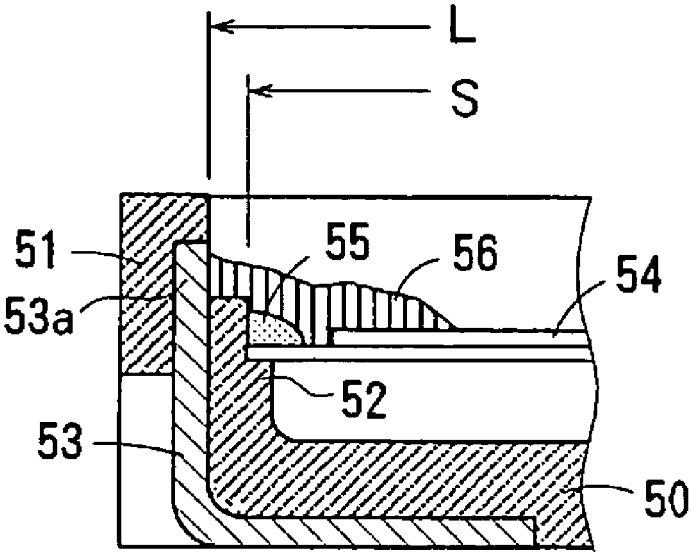
FIG. 16 is a fragmentary cross-sectional view of a piezoelectric electroacoustic transducer as a comparative example.

FIG. 16 shows a Comparative Example of a piezoelectric electroacoustic transducer compared with that of the preferred embodiments of the present invention.

In FIG. 16, a terminal 53 is provided in a case 50, and the internal connecting portion 53a of the terminal 53 is exposed at the inner side surface of the side wall 51 of the case 50. A supporting portion 52 is provided at the inner side of the side wall 51 of the case 50. A piezoelectric diaphragm 54 is placed on the supporting portion 52. The piezoelectric diaphragm 54 is fixed to the case 50 with an elastic adhesive 55. The internal connecting portion 53a of the terminal 53 is electrically connected to the piezoelectric diaphragm 54 with a conductive adhesive 56.

Also in this Comparative Example, in the same way as in Example 1, since the internal connecting portion 53a of the terminal 53 is exposed at the inner side surface of the side wall 51 of the case 50, the periphery of the piezoelectric diaphragm 54 can be brought close to the side wall 51 of the case 50. Thus, it is possible to reduce the dimensional difference (L−S) between the case 50 and the piezoelectric diaphragm 54. Therefore, it is possible to lower the resonance frequency of the piezoelectric diaphragm 54 and sound pressure.

Figure 17:
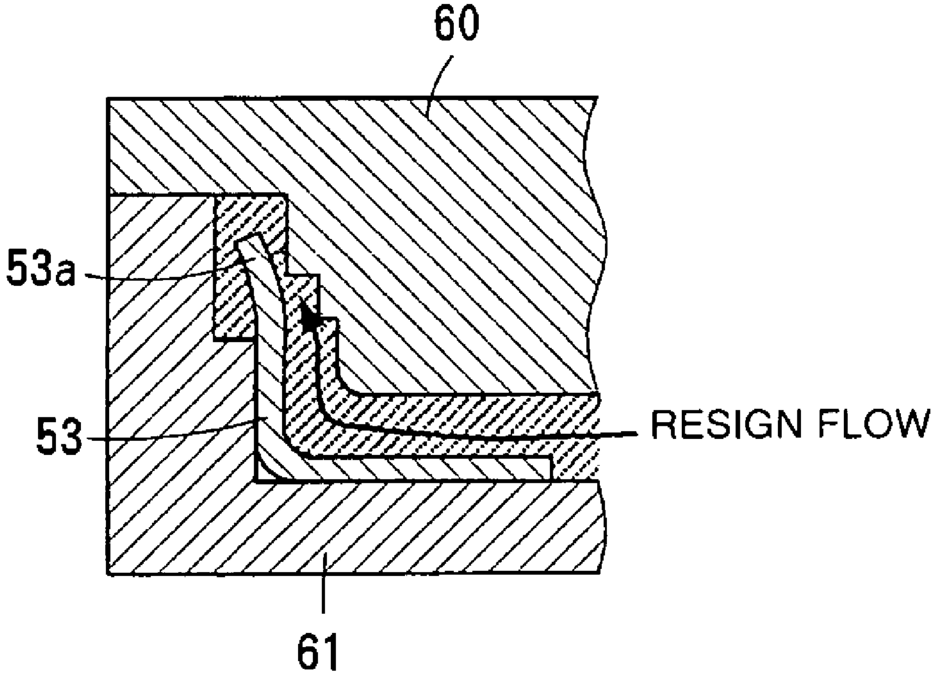
FIG. 17 is a cross-sectional view of the case shown in FIG. 16 during insert molding.

FIG. 17 shows a situation when the terminal 53 is provided in the case 50 with an upper die 60 and a lower die 61 by insert molding. A resin flows in the direction represented by an arrow. The connecting portion, specifically internal connecting portion 53a of the terminal 53, may be deformed outward because of the pressure of the resin flow, and, in some cases, the terminal 53 is not exposed at the inner side of the side wall 51.

Figures 18A, 18B, 18C:
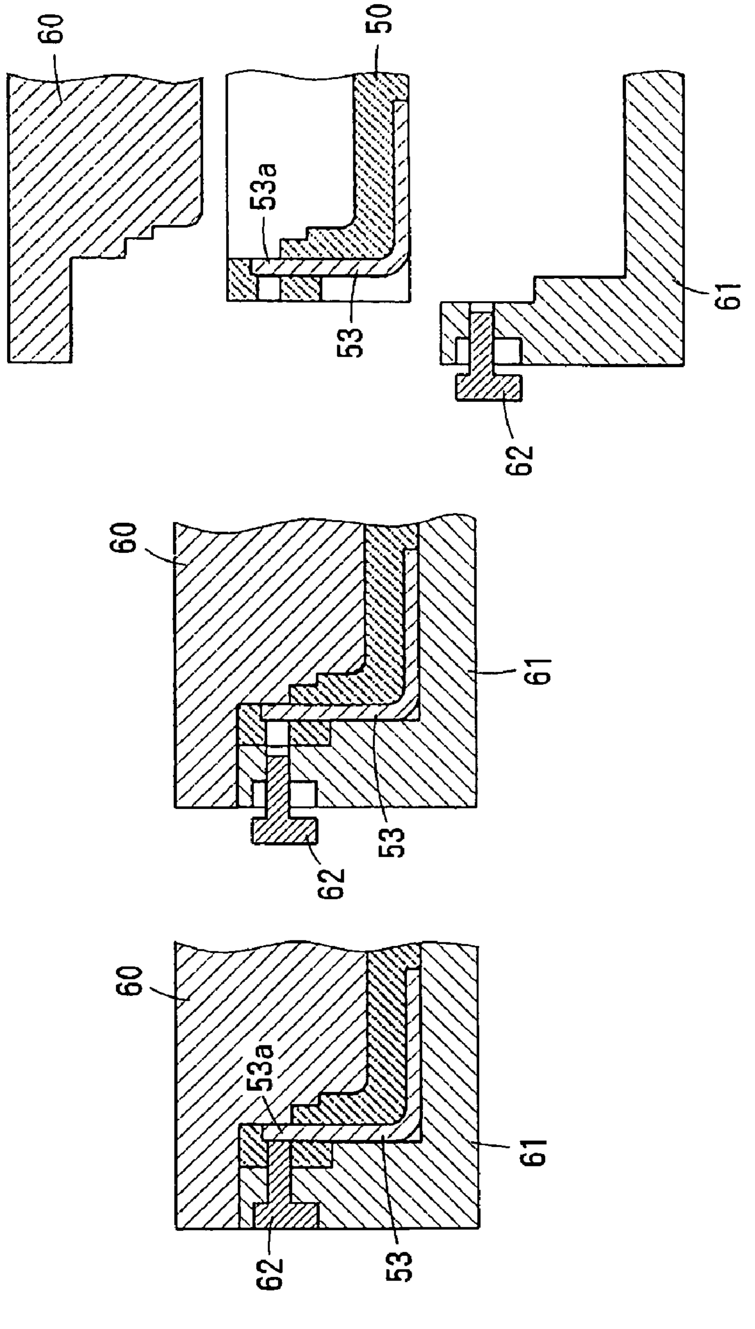
FIGS. 18A, 18B, and 18C are process drawings showing insert molding using a sliding die.

Accordingly, as shown in FIG. 18, there may be a process of performing insert molding using a sliding die 62. FIG. 18A shows a state when insert molding is performed. FIG. 18B shows a state when the sliding die is detached. FIG. 18C shows a state when the upper and lower dies are detached.

In this case, since the connecting portion 53a of the terminal 53 is held by the sliding die 62 and the upper die 60, the deformation of the terminal 53 is prevented even if a pressure is exerted by molding.

However, the process using the sliding die 62 has the following disadvantages: the occurrence of time loss due to a sliding operation, complicated and expensive dies, the difficulty of the production of a high-density multi-cavity mold, and high cost.

In contrast, in Example 1, as shown in FIG. 10A, since both front and back surfaces of the connecting portion 22a of the terminal 22 is held by the portion 35b, which is a portion of the projection 35a of the upper die 35, and the protruding portion 36b of the lower die 36, it is possible to prevent the deformation of the connecting portion 22a of the terminal 22 due to the injection pressure of a resin. Therefore, it is possible to prevent the deformation of the terminal due to the pressure in molding without using the sliding die.

EXAMPLE 2

Figure 11:
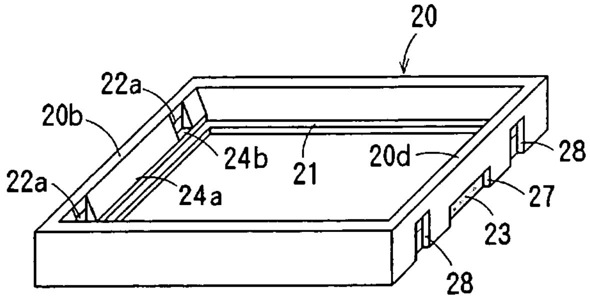
FIG. 11 is a perspective view of a case according to Example 2 of the present preferred embodiment.
Figure 12:
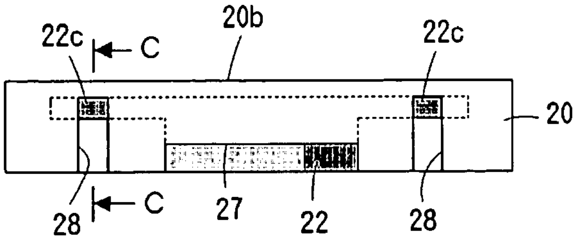
FIG. 12 is a side view of the case shown in FIG. 11.
Figure 13:
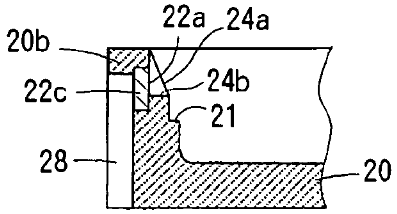
FIG. 13 is a cross-sectional view taken along line C-C in FIG. 12.

FIGS. 11 to 13 each show Example 2 of a case according to another preferred embodiment of the present invention. The same reference numerals represent the same portions in Example 1 (FIGS. 1 to 10). Redundant description is not repeated.

In Example 1, the piezoelectric diaphragm 1 is supported at the middle of each of two sides of the case 20 with the insulating materials 32 and the conductive adhesive 33, the two sides being opposite each other. In some cases, the piezoelectric diaphragm 1 is preferably supported in the vicinity of the corners depending on the vibrating characteristics of the piezoelectric diaphragm 1. Accordingly, in this example, the internal connecting portions 22a and 23a of the terminals 22 and 23 (see FIGS. 3 and 7 with respect to the internal connecting portion 23a) are exposed near the corners at the inner side surface of the side walls 20b and 20d of the case 20, the side walls being opposite each other, the internal connecting portions 22a being exposed at two positions at the inner side surface of the side wall 20b, and the internal connecting portions 23a being exposed at two positions at the inner side surface of the side wall 20d. A piezoelectric diaphragm (not shown) is supported at these exposed portions.

Arm portions 22c are provided at the connecting portions of the terminals 22 and 23 in the side walls 20b and 20d of the case 20, each of the arm portions 22c extending in the transverse direction. A pair of grooves 28 is provided at the outer side surfaces of the side walls 20b and 20d of the case 20, each of the grooves 28 extending vertically downward, and the outer side surfaces corresponding to the arm portions 22c. In this case, each of the cutouts 27 for exposing the outer side surfaces of the connecting portions of the terminals 22 and 23 is separately provided at the middle between the pair of grooves 28.

Tapered surfaces 24a each inclined inward are provided at the inner side surfaces of the side walls 20b and 20d of the case 20. Cutouts 24b for partially exposing the arm portions 22c and 23c, i.e. the cutouts 24b for exposing the internal connecting portions 22a and 23a, are provided at the two positions of each of the tapered surfaces 24a. Since the internal connecting portions 22a and 23a are each disposed at a position outward of the tapered surface 24a, it is possible to prevent the direct contact between the metal plate 2 and the terminals 22 and 23 when the piezoelectric diaphragm 1 is placed on the supporting portion 21. Furthermore, the tapered surfaces 24*a* function as guiding surfaces when placing the piezoelectric diaphragm 1 in the case 20.

In this example, two internal connecting portions 22*a* of the terminal 22 and two internal connecting portions 23*a* of the terminal 23 are exposed at the inner side surfaces, specifically the tapered surfaces 24*a*, of the side walls 20*b* and 20*d*, respectively, of the case 20. However, single internal connecting portion 22*a* and single internal connecting portion 23*a* may be exposed at the inner side surfaces of the side walls 20*b* and 20*d*, respectively.

Figure 14A:
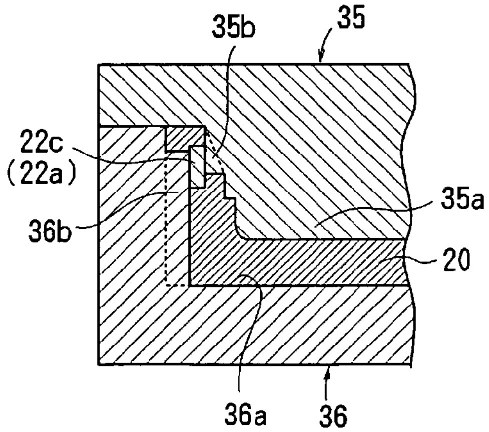
FIGS. 14A and 14B are process drawings showing a process for providing a terminal in a case according to Example 2 by insert molding.
Figure 14B:
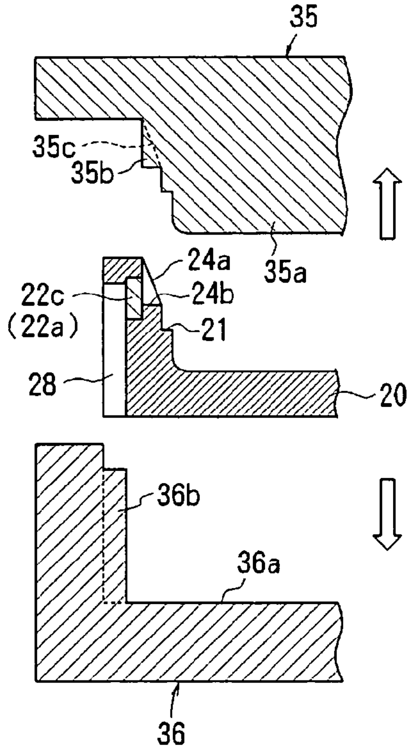
Figure 15:
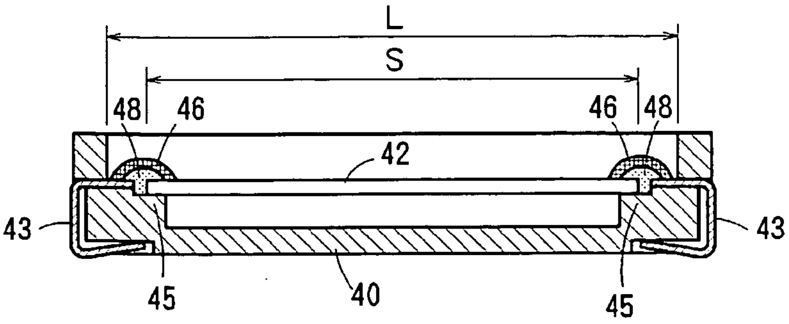
FIG.15 PRIOR ART
FIG. 15 is a cross-sectional view of an example of a known piezoelectric electroacoustic transducer.

FIGS. 14A and 14B show a process of insert-molding the terminals 22 and 23 into the case 20 in Example 2.

FIG. 14A shows a state in which an upper die 35 and a lower die 36 are clamped, and FIG. 14B shows a state in which the upper die 35 and the lower die 36 are detached.

In the same way as in FIGS. 10A and 10B, the upper die 35 includes the projection 35*a* for forming the inner surface of the case 20. The side surface 35*c* of the projection 35*a* has a tapered shape. A protruding portion 35*b* protruding outward is provided at a portion of the side surface. The protruding portion 35*b* corresponds to the cutout 24*b*. The lower die 36 includes the depression 36*a* for forming the outer surface of the case 20. The protruding portion 36*b* is provided at a portion of the side surface of the depression 36*a*, the protruding portion 36*b* protruding inward. The protruding portion 36*b* corresponds to the groove 28. Furthermore, another protruding portion (not shown) corresponding to the cutout 27 other than the protruding portion 36*b* is also provided. The top end of the protruding portion 36*b* is disposed at a position lower than the position of the upper end of the arm portion 22*c* of the terminal 22. The lower end of the protruding portion 36*b* extends to the bottom surface of the depression 36*a*. A cavity is formed between the projection 35*a* and the depression 36*a*.

As shown in FIG. 14A, the L shaped terminal 22 is disposed between the upper and lower dies 35 and 36, and then the dies are clamped. In the clamped state, the bottom plate portion 22*b*, specifically the external connecting portion, of the terminal 22 is disposed on the bottom surface of the depression 36*a* of the lower die 36. Furthermore, both front and back surfaces of the internal connecting portion 22*a* of the terminal 22 are held by the protruding portion 35*b* of the upper die 35 and the protruding portion 36*b* of the lower die 36, thus preventing the deformation of the internal connecting portion 22*a* of the terminal 22 due to the injection pressure of a resin.

As shown in FIG. 14B, the upper and lower dies 35 and 36 are detached vertically. The inside space of the case 20 is formed by the projection 35*a* of the upper die 35. The outer surface of the case 20 is formed by the depression 36*a* of the lower die 36. The groove 28 is formed by the protruding portion 36*b* of the lower die 36. The tapered surface 24*a* is formed by the side surface 35*c* of the projection 35*a* of the upper die 35. The cutout 24*b* is formed by the projection 35*a*. Thus, the internal connecting portion 22*a* of the terminal 22 can be exposed at the tapered surface 24*a* at the inner side of the side wall 20*b* of the case 20.

The present invention is not limited to the above-described examples of preferred embodiments thereof.

The piezoelectric diaphragm 1 in the examples has a structure in which a laminated piezoelectric component 4 is bonded to a metal plate. The piezoelectric component is not limited to a laminated structure but may have a single-plate structure.

The piezoelectric diaphragm in the present invention is not limited to a unimorph structure in which a piezoelectric component is bonded to a metal plate, but may have a bimorph structure including only a laminated piezoceramic, as described in Japanese Unexamined Patent Application Publication No. 2001-95094.

In the above-described examples, the supporting portions for supporting four sides of the piezoelectric diaphragm are provided at the inner side of the case. However, the supporting portions may be provided at two sides exposing the terminals or at four corners.

In the above-described examples, the cabinet includes the box-shaped case and the cover for covering the opening of the case. However, the structure of the cabinet is not limited thereto.

The present invention is not limited to an electroacoustic transducer used in a resonance region, for example, a piezoelectric sounder, but is applicable to an electroacoustic transducer usable in wide frequencies, for example, a piezoelectric receiver.

Furthermore, it is understood that the case of the present invention is also applicable to various electronic components other than piezoelectric electroacoustic transducers.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An insert terminal containing case comprising:

a bottom wall, four side walls, and an opening at an upper portion of the case;

a terminal made of a metal plate vertically fixed to at least one of the four side walls; and a groove vertically disposed at an outer side surface of the side wall fixing the terminal, the groove extending downward, wherein an outer side surface of the terminal is partially exposed at the groove; wherein an inner side surface of the terminal, opposite the outer side surface of the terminal exposed at the groove, is partially exposed at an inner side surface of the side wall.

2. The insert terminal containing case according to claim 1, further comprising a cutout arranged to expose the outer side surface of the terminal in the vicinity of a bottom of the outer side surface of the side wall, an area of the terminal exposed at the cutout being greater than an area of the terminal exposed at the groove, wherein a lower end of the groove is extended to the cutout.

3. The insert terminal containing case according to claim 1, wherein an upper end of the groove is terminated at a position lower than a position of an upper end of the terminal.

4. The insert terminal containing case according to claim 1, wherein the terminal is L-shaped, and a vertical portion of the L-shaped terminal includes the outer side surface and the inner side surface of the terminal.

5. A piezoelectric electroacoustic transducer comprising the case according to claim 1, a piezoelectric diaphragm having at least two electrodes, and a cover fixed to the opening at the upper portion of the case, wherein two of said four side walls that are disposed opposite each other each include a terminal, and the inner side surface of each terminal exposed at the inner side surface of the corresponding side wall is electrically connected to one of the at least two electrodes of the piezoelectric diaphragm.

* * * * *